(12) United States Patent
Zhang (10) Patent No.: US 7,952,904 B2
(45) Date of Patent: *May 31, 2011

(54) THREE-DIMENSIONAL MEMORY-BASED THREE-DIMENSIONAL MEMORY MODULE

(76) Inventor: Guobiao Zhang, Corvallis, OR (US)

( * ) Notice: Subject to any disclaimer, the term of this patent is extended or adjusted under 35 U.S.C. 154(b) by 614 days.

This patent is subject to a terminal disclaimer.

(21) Appl. No.: 12/043,128

(22) Filed: Mar. 5, 2008

(65) Prior Publication Data

US 2008/0159722 A1 Jul. 3, 2008

Related U.S. Application Data

(63) Continuation-in-part of application No. 11/736,777, filed on Apr. 18, 2007, and a continuation-in-part of application No. 12/013,415, filed on Jan. 11, 2008.

(60) Provisional application No. 60/889,537, filed on Feb. 12, 2007, provisional application No. 60/767,573, filed on Aug. 30, 2006, provisional application No. 60/971,321, filed on Sep. 11, 2007.

(51) Int. Cl.
 *G11C 5/02* (2006.01)

(52) U.S. Cl. ............................ 365/51; 365/45; 365/211
(58) Field of Classification Search .................... 365/45, 365/51, 211
See application file for complete search history.

(56) References Cited

U.S. PATENT DOCUMENTS

| | | | | |
|---|---|---|---|---|
| 5,835,396 A | * | 11/1998 | Zhang | 365/51 |
| 6,515,888 B2 | * | 2/2003 | Johnson et al. | 365/130 |
| 2004/0255322 A1 | * | 12/2004 | Meadows et al. | 725/23 |
| 2005/0005149 A1 | * | 1/2005 | Hirota et al. | 713/193 |
| 2008/0056683 A1 | * | 3/2008 | Zhang | 386/124 |
| 2008/0162850 A1 | * | 7/2008 | Zhang | 711/163 |
| 2009/0070214 A1 | * | 3/2009 | Zhang | 705/14 |

\* cited by examiner

*Primary Examiner* — Pho M Luu (57) ABSTRACT

Three-dimensional-memory-based three-dimensional memory module ($3D^2$-$M^2$) is a three-dimensional memory module (3D-MM) comprising a plurality of three-dimensional mask-programmable memory (3D-mM) chips. It is an ultra-low-cost, ultra-large-capacity and small-form-factor memory module. By further incorporating a usage-control (UC) block, $3D^2$-$M^2$ enables a pricing model more acceptable to consumers, i.e. the hardware is sold at a low initial selling price (ISP) and the user only pays for the selected usage(s).

20 Claims, 11 Drawing Sheets

TABLE 1. compares the storage capacities of a 3D-mM chip, a 3D-OTP chip and a flash memory chip, at different technology nodes.

| Node | 3D-mM | 3D-OTP | flash |
|---|---|---|---|
| 50nm | ~16GB | ~4GB | 2GB |
| 35nm | ~32GB | ? | 4GB |
| 25nm | ~64GB | ? | ? |
| 17nm | ~128GB | ? | ? |

TABLE 2. lists the number of 3D-mM chips (x*M*) in a 3D$^2$-M$^2$, the storage capacity of a 3D$^2$-M$^2$ and the number of movies that can be stored in a 3D$^2$-M$^2$, at different technology nodes.

| Node | x*M* | Storage Capacity | Number of Movies |
|---|---|---|---|
| 50nm | x4 | ~64GB | ~120 |
| 35nm | x8 | ~256GB | ~500 |
| 25nm | x8 | ~512GB | ~1,000 |
| 17nm | x8 | ~1TB | ~2,000 |

THREE-DIMENSIONAL MEMORY-BASED THREE-DIMENSIONAL MEMORY MODULE

CROSS-REFERENCE TO RELATED APPLICATIONS

This application is a continuation-in-part of U.S. patent application Ser. No. 11/736,777, filed Apr. 18, 2007, which is related to U.S. Provisional Patent Application No. 60/889,537, filed Feb. 12, 2007; China, P. R. Patent Application No. 200610022444.0, filed Dec. 8, 2006; and U.S. Provisional Patent Application No. 60/767,573, filed Aug. 30, 2006. This application is also a continuation-in-part of U.S. patent application Ser. No. 12/013,415, filed Jan. 11, 2008, which is related to U.S. Provisional Patent Application No. 60/971,321, filed Sep. 11, 2007.

BACKGROUND

1. Technical Field of the Invention

The present invention relates to the field of integrated circuit packaging, and more particularly to the packaging of three-dimensional memory (3D-M).

2. Prior Arts

A three-dimensional memory (3D-M) chip comprises a plurality of vertically stacked memory levels. By using 3D-stacking, 3D-M has an increased storage capacity. However, because 3D-stacking is a very demanding manufacturing process, only three-dimensional one-time-programmable memory (3D-OTP) and three-dimensional mask-programmable memory (3D-mM) can be mass-produced in the foreseeable future. For these 3D-M's, their contents are generally recorded before customer delivery. Accordingly, they are primarily used as pre-recorded memory. As a pre-recorded memory, 3D-M is expected to store a large amount of multimedia contents, particularly a movie library.

Figure 1A:
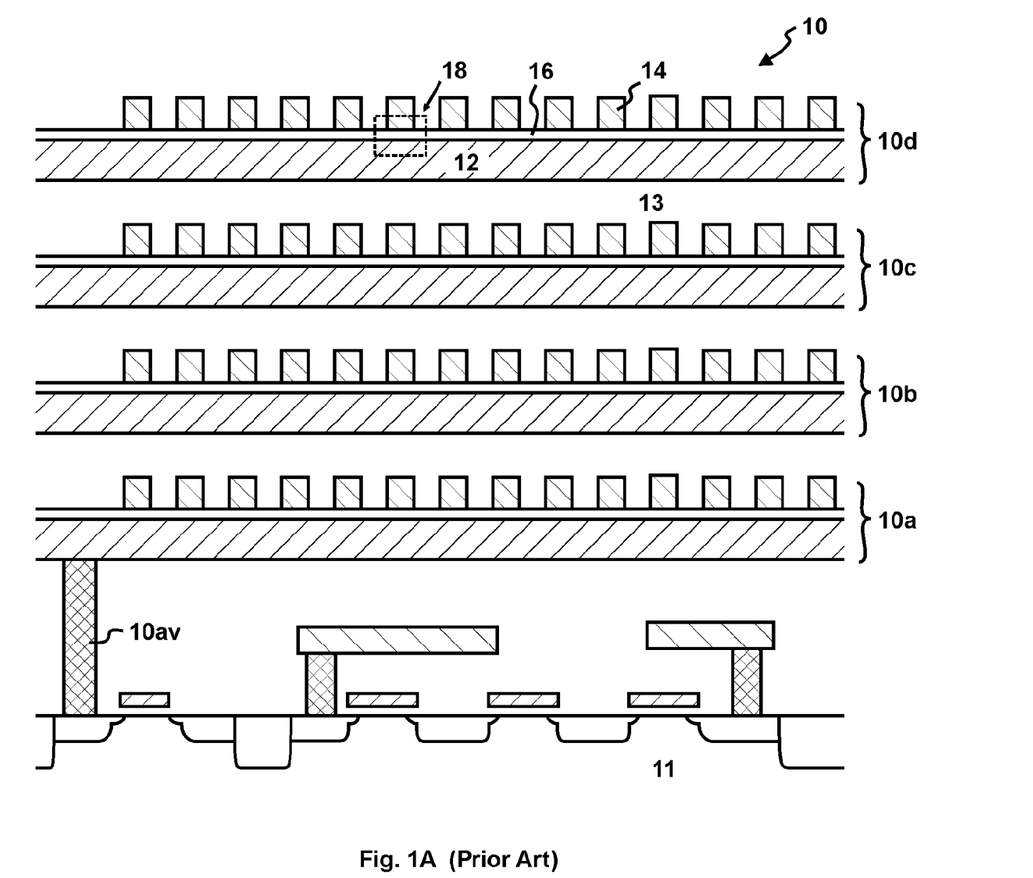
FIG. 1A illustrates a 3D-OTP used in a prior-art 3D-M module.

U.S. Pat. Nos. 5,835,396, 6,034,882, 6,385,074 and others disclose various types of 3D-M. FIG. 1A illustrates a typical 3D-M, i.e. 3D-OTP 10 (referring to Moore, "Matrix Semiconductor White Paper, Matrix 3-D Memory Roadmap Advancements", May 2005; and U.S. Pat. No. 5,835,396). It comprises four memory levels 10*a*-10*d*. Each memory level comprises a plurality of word lines (e.g. 12), bit lines (e.g. 14) and memory cells (e.g. 18). Each memory cell 18 further comprises a diode (not shown in the figure) and an antifuse 16. The antifuse 16 comprises a layer of insulating dielectric, which breaks down during programming. This leads to a high resistance before programming and low resistance after programming. Inter-level dielectric 13 provides electrical separation between memory levels (e.g. 10*c*, 10*d*). Memory-level vias (also known as interlevel connecting vias in the '396 patent) (e.g. 10*av*) provide electrical connection between memory levels (e.g. 10*a*) and the substrate 11. At present, industry generally believes that, among all 3D-M's, 3D-OTP has the greatest commercial potential; and the majority research and development efforts are devoted into this area.

Figure 1B:
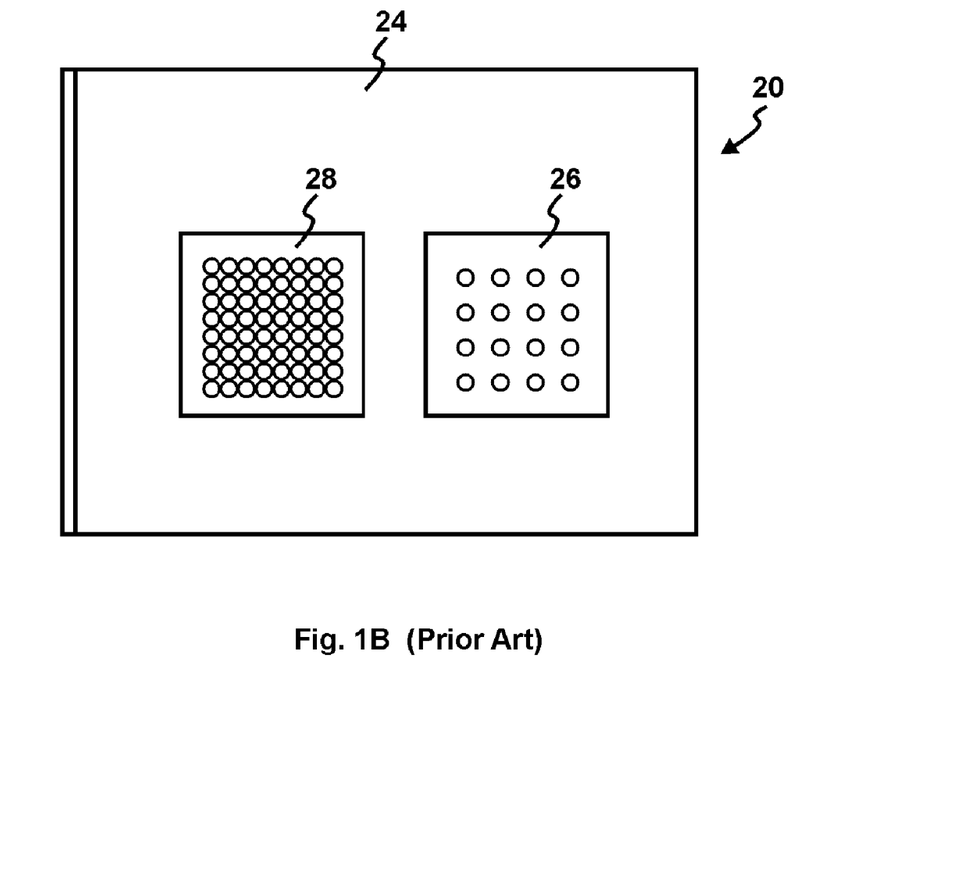
FIG. 1B illustrates a prior-art 3D-M module.

Before shipping, a 3D-M chip needs to be packaged into a 3D-M module. U.S. Pat. No. 6,545,891 discloses such a 3D-M module 20. As illustrated in FIG. 1B, it is housed in a standard memory package (e.g. CompactFlash card or SecureDigital card), which can be easily inserted into or pulled out from a mobile device. This 3D-M module 20 comprises a single 3D-M chip 26 and an interface chip 28, which are placed side-by-side on a substrate 24. Its 3D-M chip 26 is a 3D-OTP (see FIG. 9 of the '891 patent); and its interface chip 28 converts the 3D-M data into a standard format (e.g. CompactFlash format or SecureDigital format), but does not limit access to the 3D-M data.

Figure 1C:
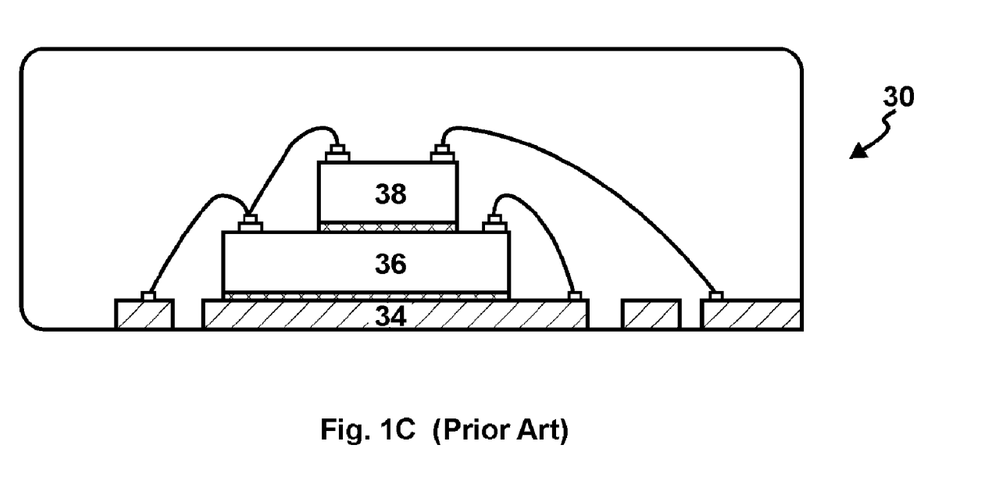
FIG. 1C illustrates another prior-art 3D-M module.

U.S. Pat. No. 6,731,011 discloses another 3D-M module 30. As illustrated in FIG. 1C, it also comprises a 3D-M chip 36 and an interface chip 38, which are vertically stacked on a substrate 34. Similar to FIG. 1B, its 3D-M chip 36 is preferably a 3D-OTP (see FIG. 6 of the '011 patent); and its interface chip 38 does not limit access to the 3D-M data.

The prior-art 3D-M module (20 or 30) prefers 3D-OTP (26 or 36) as its 3D-M chip. However, among all 3D-M's, 3D-OTP has neither the largest storage capacity, nor the lowest storage cost. In fact, 3D-mM excels 3D-OTP in both aspects (referring to FIG. 5/Table 1). Adding the fact that it typically just comprises a single 3D-M chip, the prior-art 3D-M module has a limited growth potential in storage capacity.

Besides having a limited storage capacity, the prior-art 3D-M module (20 or 30) faces a more serious hurdle—its pricing model is hard to accept for most consumers. Because the interface chip of the prior-art 3D-M module does not limit access to its contents, a customer can access any of its contents upon obtaining it. This means all copyright fees must be paid upfront during purchase. Accordingly, the initial selling price (ISP) of the prior-art 3D-M module should include not only its hardware cost, but also the copyright fees of all contents. As more and more contents are stored in a 3D-M module, the pre-recorded memory based on the prior-art 3D-M module will have a very high ISP, and this will lead to a high market entry barrier. For example, by using the storage-enhancing means disclosed in the present invention, a 3D-M module can store ~64 GB, or ~120 movies, which require an ISP of ~$1,000, a number too high for most consumers. In addition, charging all copyright fees upfront is not fair, because consumers may not want to access all contents in a 3D-M module and do not wish to pay for the contents they are not interest in.

In order to overcome these drawbacks, the present invention discloses a three-dimensional-memory-based three-dimensional memory module ($3D^2$-$M^2$) and system thereof. $3D^2$-$M^2$ is an ultra-low-cost, ultra-large-capacity and small-form-factor memory module, whose pricing model is more acceptable to consumers.

OBJECTS AND ADVANTAGES

It is a principle object of the present invention to provide an ultra-low-cost, ultra-large-capacity and small-form-factor memory module whose pricing model is more acceptable to consumers.

It is another object of the present invention to provide an ultra-low-cost, ultra-large-capacity and small-form-factor memory module which can store a pre-recorded multimedia library (PML).

It is another object of the present invention to provide an ultra-low-cost, ultra-large-capacity and small-form-factor memory module which can store a pre-recorded movie library (PmL) at a movie storage cost comparable to DVD.

It is another object of the present invention to provide an ultra-low-cost, ultra-large-capacity and small-form-factor memory module, which has a low initial selling price (ISP) and allows a user to just pay for the selected usage(s).

In accordance with these and other objects of the present invention, the present invention discloses a three-dimensional-memory-based three-dimensional memory module ($3D^2$-$M^2$) and system thereof.

SUMMARY OF THE INVENTION

The present invention discloses a three-dimensional-memory-based three-dimensional memory module ($3D^2$-

$M^2$). It comprises: a plurality of vertically stacked three-dimensional mask-programmable memory (3D-mM) chips for storing a pre-recorded multimedia library (PML), each of said 3D-mM chip comprising a plurality of vertically stacked mask-programmable memory levels; and a usage-control (UC) block for controlling the usage of said PML.

The present invention further discloses a $3D^2$-$M^2$ system. It comprises: a three-dimensional memory module (3D-MM) comprising a plurality of vertically stacked 3D-mM chips for storing a PML, wherein each of said 3D-mM chip comprises a plurality of vertically stacked mask-programmable memory levels; and an UC block for controlling the usage of said PML.

The $3D^2$ in $3D^2$-$M^2$ means two 3D-stackings: 3D-stacking of multiple memory levels in a 3D-mM chip; and 3D-stacking of multiple memory chips in a 3D-MM module. The 3D-stacking in the 3D-mM chip makes it a large-capacity and ultra-low-cost memory chip; while the 3D-stacking in the 3D-MM module makes it an ultra-large-capacity and small-form-factor memory package. Overall, through two 3D-stackings, $3D^2$-$M^2$ becomes an ultra-low-cost, ultra-large-capacity and small-form-factor memory module.

Unlike prior arts, $3D^2$-$M^2$ is not based on 3D-OTP, but based on 3D-mM. Because 3D-mM does not require electrical programming, its structure, design and manufacturing are much simpler than 3D-OTP. At the same technology node, 3D-mM has a storage capacity ~4 times larger, or a storage cost ~4 times less than 3D-OTP; and these gaps will become even wider with time. $3D^2$-$M^2$ can store a PML, more particularly can store a pre-recorded movie library (PmL) at a movie storage cost (i.e. average storage cost per movie) comparable to DVD.

The UC block in $3D^2$-$M^2$ and $3D^2$-$M^2$ system limits access to the PML. This allows a user to just pay for the selected usage(s). Moreover, by distributing the hardware cost into the usage fee(s), $3D^2$-$M^2$ and $3D^2$-$M^2$ system can be obtained at a low initial selling price (ISP). This pricing model—the hardware is sold at a low ISP and the user only pays for the selected usage(s)—is more acceptable to consumers. Moreover, to reduce usage fee(s), advertisements can be played back during content playback.

BRIEF DESCRIPTION OF THE DRAWINGS

For reason of simplicity, in FIGS. 1A and 4, diode(s) in the 3D-mM cells are not shown. In FIG. 5 (Table 1), "~" means an estimated value and "?" means it is unlikely to scale the memory to this technology node.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 2A:
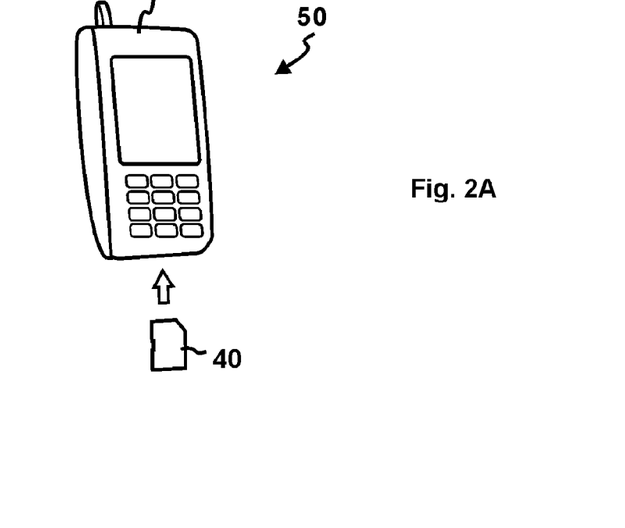
FIG. 2A illustrates a preferred $3D^2$-$M^2$ system.

Referring now to FIG. 2A, a preferred $3D^2$-$M^2$ system 50 is illustrated. It comprises a mobile device 58 and a $3D^2$-$M^2$ 40. The mobile device 58 plays back the pre-recorded contents stored in the $3D^2$-$M^2$ 40. It could be a cellular phone, a mobile audio player (e.g. mp3 player), a mobile video player (e.g. mp4 player), a mobile game machine, a GPS device, a portable computer and others. The $3D^2$-$M^2$ 40 stores the pre-recorded contents to be played by the mobile device 58. It can be inserted into and pulled out from the mobile device 58; or, it can be embedded into the mobile device 58. Besides being used in mobile devices, the $3D^2$-$M^2$ 40 can also be used in non-mobile devices at home or in office, e.g. in audio player, video player, game machine, computer and others.

Figure 2B:
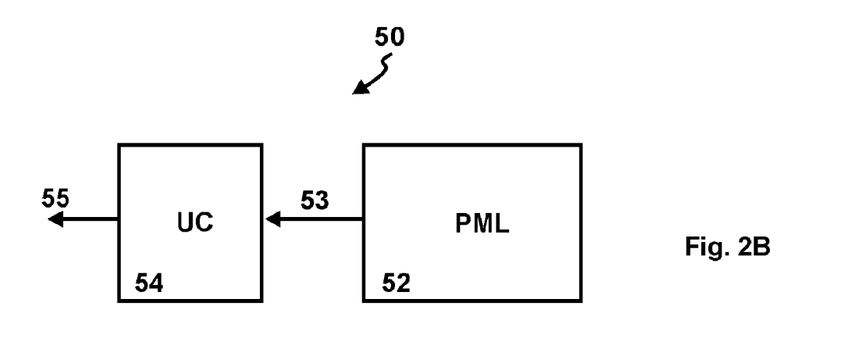
FIG. 2B is a block diagram of the preferred $3D^2$-$M^2$ system.

Referring now to FIG. 2B, a block diagram of the preferred $3D^2$-$M^2$ system 50 is disclosed. It comprises two functional blocks: a pre-recorded multimedia library (PML) 52 and a usage-control (UC) block 54. The PML 52 is stored in the $3D^2$-$M^2$ 40. It contains a large amount of textual, audio, image, video, game, and/or software contents. One PML of great value is pre-recorded movie library (PmL). Here, PmL contains not just a small number of movies, but at least tens of movies, preferably hundreds of movies. Note that movies could be regular movies, TV programs, video games and other video contents.

Figure 11B:
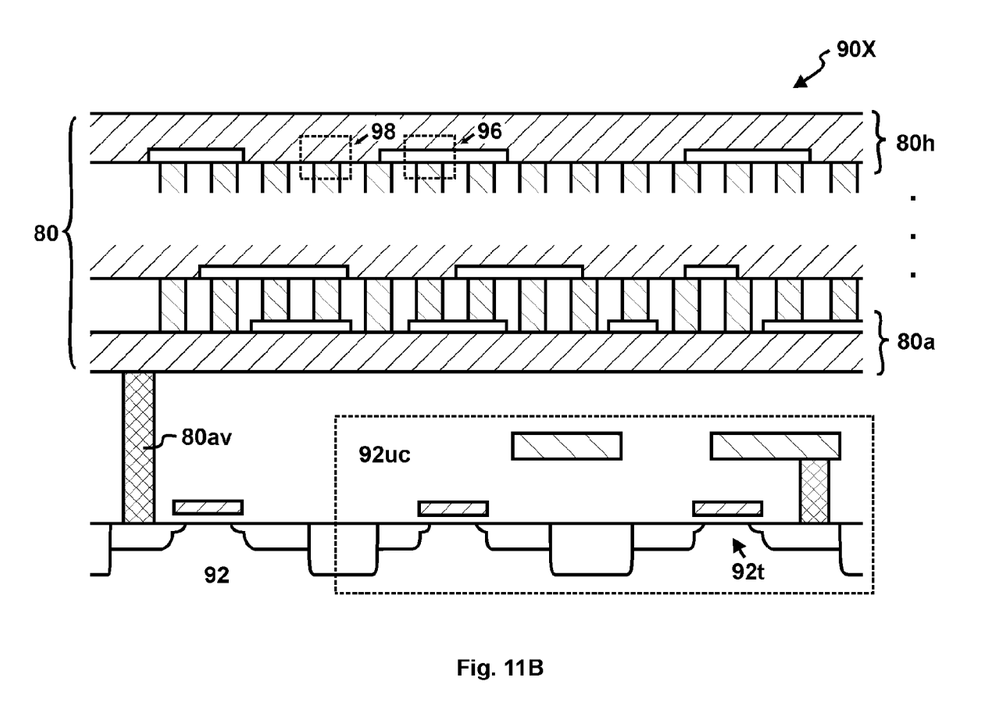
Figure 12A:
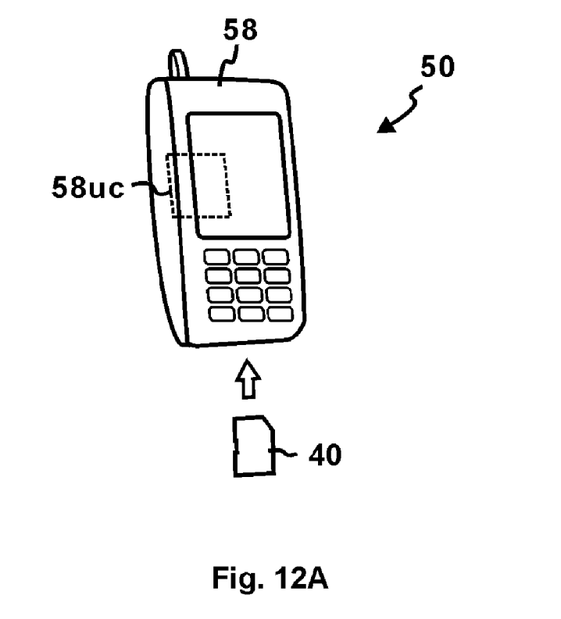
FIGS. 12A-12B illustrate another preferred $3D^2$-$M^2$ system and its encrypted $3D^2$-$M^2$.

The UC block 54 limits access to the PML 52, thus allowing a user to just pay for the selected usage(s). During usage, the PML readout 53 is fed into the UC block 54, which decides whether the user has the rights to access. If affirmative, the PML readout 53 is further sent to the $3D^2$-$M^2$ output 55. As will be disclosed below, the UC block 54 can be located in the substrate 92 of a 3D-mM chip 90X (FIG. 11B), in a separate UC chip 44 of the $3D^2$-$M^2$ 40 (FIG. 3), or in the mobile device 58 (FIG. 12A).

Figure 3:
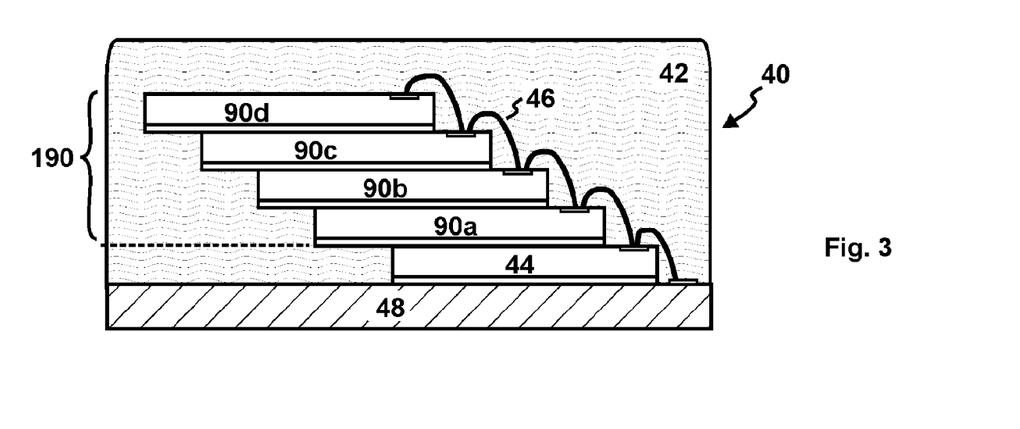
FIG. 3 is a cross-sectional view of a preferred $3D^2$-$M^2$.

Referring now to FIG. 3, the cross-sectional view of a preferred $3D^2$-$M^2$ 40 is disclosed. This preferred embodiment is a three-dimensional memory module (3D-MM), which comprises a plurality of vertically stacked memory chips. To be more specific, it comprises four 3D-mM chips 90a-90d and an UC chip 44. The four vertically stacked 3D-mM chips 90a-90d form a 3D-MM stack 190 and store the PML 52. The UC chip 44 comprises the UC block 54 and is stacked on a substrate 48. In this preferred embodiment, the UC chip 44 is located under the 3D-MM stack 190. Alternately, it can be located above the 3D-MM stack 190, or in the middle of the 3D-MM stack 190.

In this preferred embodiment, the 3D-mM chips 90a-90d, the UC chip 44 and the bond wire 46 between chips are preferably encapsulated in a protective package 42, such as in a molding compound. Because the bond wire 46 is located inside the protective package 42, the PML data are never exposed to the external world. As a result, the PML 52 stored in the 3D-MM stack 190 is well protected and its data could be in plaintext. Alternatively, the PML data could be encrypted (referring to FIG. 13B).

Figure 4:
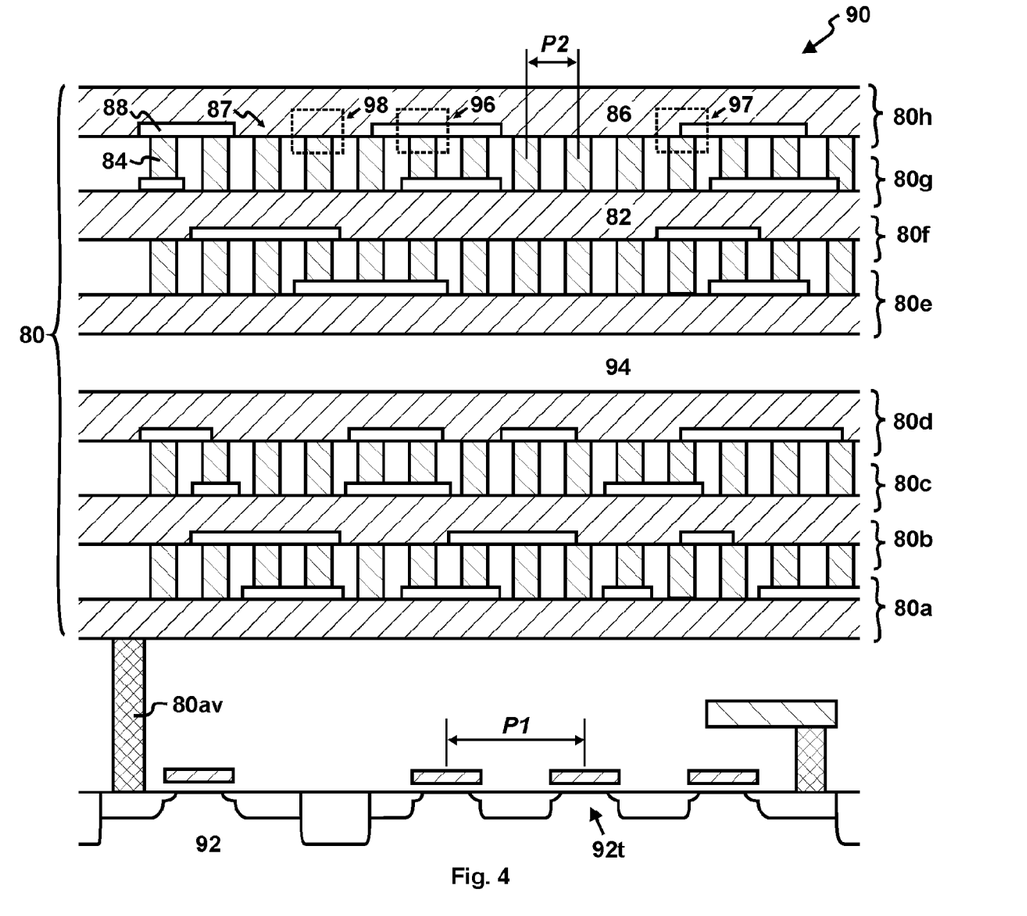
FIG. 4 is a cross-sectional view of a preferred 3D-mM chip.

3D-mM is one cornerstone of the $3D^2$-$M^2$. It has a much larger storage capacity and lower storage cost than 3D-OTP. FIG. 4 illustrates a preferred 3D-mM chip 90. It comprises eight vertically stacked memory levels 80a-80h, which form a 3D-mM stack 80. Each memory level (e.g. 80h) comprises a plurality of word lines (e.g. 84), bit lines (e.g. 86) and 3D-mM cells (e.g. 96, 97, 98). It is coupled with the substrate 92 through a plurality of memory-level vias (e.g. 80av). In this preferred embodiment, the 3D-mM cells 96 and 98 store logic "0" and "1", respectively. They have different structures: at the 3D-mM cell 96, an info-dielectric 88 separates the word line from the bit line; while at the 3D-mM cell 98, the word line is connected with the bit line through an opening 87 in the info-dielectric 88. Here, 3D-mM cell 98 further comprises a diode (not shown). Its electrical resistance is higher when the current flows in one direction than the other.

Because 3D-mM does not require electrical programming, its structure, design and manufacturing are much simpler than 3D-OTP. For example, 3D-mM can use a simpler peripheral circuit (i.e. read circuit only) than 3D-OTP and therefore, has a better array efficiency (i.e. the ratio of the total memory-cell area and the total chip area). To further increase its storage capacity, 3D-mM can use advanced techniques such as N-ary 3D-mM, hybrid-level 3D-mM and small-pitch 3D-mM.

In an N-ary 3D-mM, the 3D-mM cell can have N(N>2) possible states. In the preferred embodiment of FIG. 4, the 3D-mM cell 97 is in a third state, where the info-dielectric 88 does not completely isolate the word line from the bit line. Another way to implement an N-ary 3D-mM is by changing the doping profile of the 3D-mM cell 97 so that it has a different IV characteristic than the 3D-mM cell 98. Having N possible states, the N-ary 3D-mM 90 supports multi-bit-per-cell. In contrast, because it is difficult to control the antifuse's post-programming resistance, 3D-OTP 10 only supports single-bit-per-cell. More details on the N-ary 3D-mM are disclosed in U.S. patent application Ser. No. 11/162,262, "N-ary Mask-Programmable Memory", filed Sep. 2, 2005.

In a hybrid-level 3D-mM, some memory levels (e.g. 80e, 80d) are separated by an inter-level dielectric 94, while other memory levels (80a-80d, 80e-80h) are interleaved, i.e. adjacent memory levels (e.g. 80g, 80h) share one level of address-selection lines (e.g. 84). In contrast, to avoid inadvertent programming between memory levels, all memory levels (10a-10d) in the 3D-OTP 10 are separated by an inter-level dielectric 13 (FIG. 1A). By interleaving memory levels, 3D-mM has a more compact structure and an increased storage capacity. More details on the hybrid-level 3D-mM are disclosed in U.S. patent application Ser. No. 11/736,767, "Hybrid-Level Three-Dimensional Memory", filed Apr. 18, 2007.

In a small-pitch 3D-mM, the minimum pitch (P2) of address-selection lines (e.g. 84) in a 3D-mM level (e.g. 80h) is smaller than the minimum gate pitch (P1) of the substrate transistors 92t. Here, pitch is the center-to-center distance between adjacent lines. The small-pitch 3D-mM becomes possible because the 3D-mM cells (e.g. 96, 97, 98) are based on diode, which follows a different scaling rule than transistor—the scaling of diode is much easier than transistor. Furthermore, because the 3D-mM cells (e.g. 96, 97, 98) comprise no antifuse and do not need to tolerate a large programming current, 3D-mM can be scaled to more advanced technology nodes than 3D-OTP. More details on the small-pitch 3D-mM are disclosed in U.S. patent application Ser. No. 11/936,069, "Small-Pitch Mask-programmable three-dimensional memory", filed Nov. 6, 2007.

Figure 5:
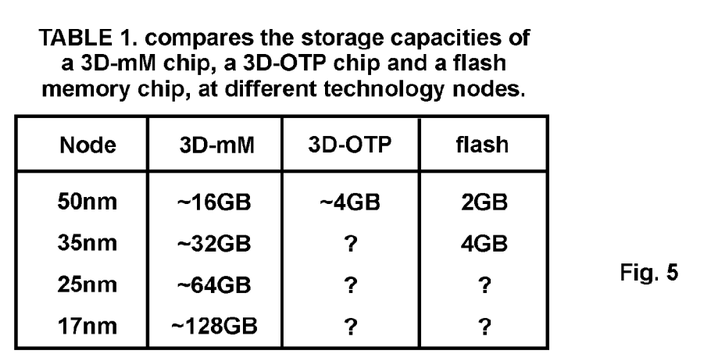
FIG. 5 (Table 1) compares the storage capacities of a 3D-mM chip, a 3D-OTP chip and a flash memory chip, at different technology nodes.

FIG. 5 (Table 1) compares the storage capacities of a 3D-mM chip, a 3D-OTP chip and a flash memory chip, at different technology nodes. At the same technology node, 3D-mM has a storage capacity ~4 times larger, or a storage cost ~4 times less than 3D-OTP. Moreover, these gaps will become even wider with time. At the 50 nm node, a 3D-mM chip can store ~16 GB, or ~32 movies. Its movie storage cost is ~$0.4. This is comparable to DVD, whose movie storage cost is ~$0.2-$0.7. Furthermore, 3D-OTP will unlikely scale beyond 50 nm, while 3D-mM can scale down to 17 nm. At the 17 nm node, a 3D-mM chip can store ~128 GB, or ~250 movies, with movie storage cost as low as ~$0.05.

Figure 6A:
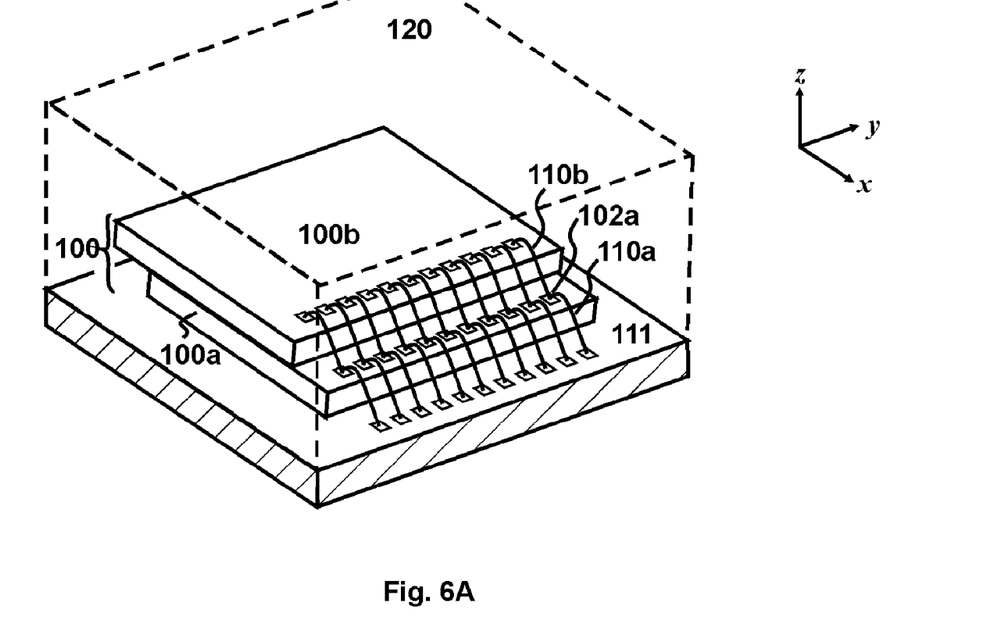
FIGS. 6A-6B are perspective and z-x cross-sectional views of a preferred offset 3D-MM.
Figure 6B:
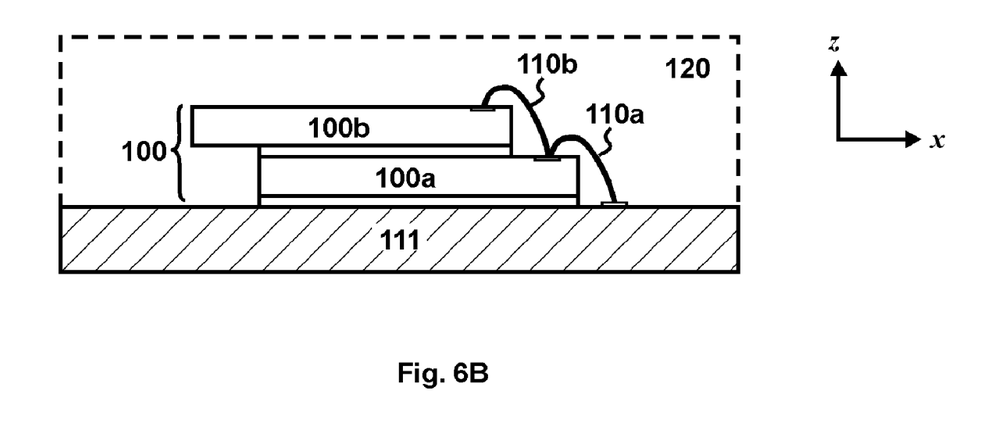
Figure 7:
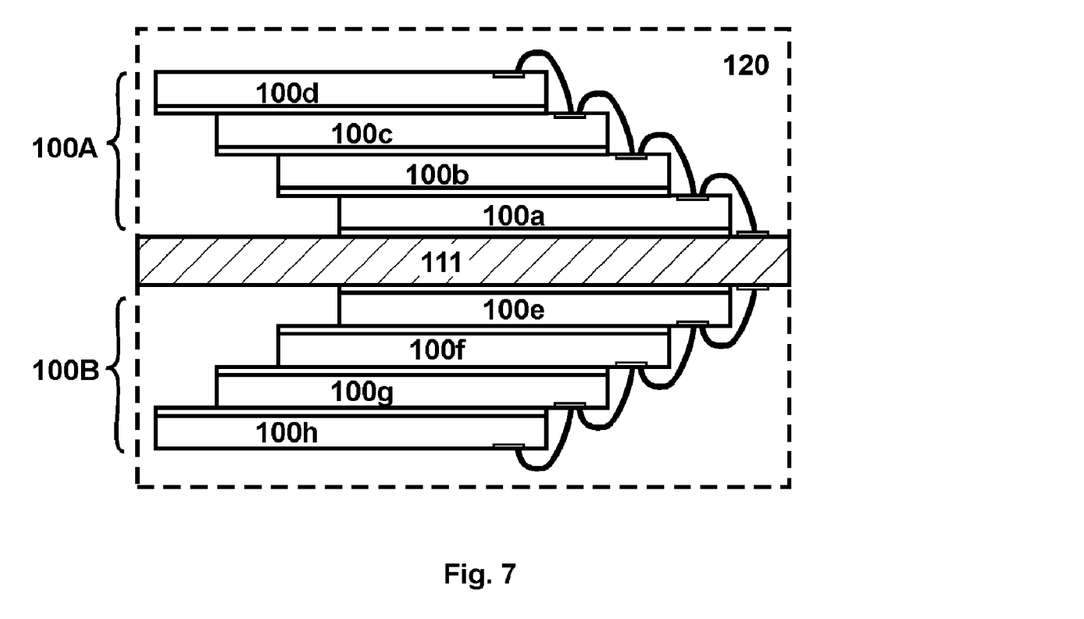
FIG. 7 is a cross-sectional view of a preferred double-sided 3D-MM.

3D-MM is another cornerstone of the $3D^2$-$M^2$. It can significantly increase the storage capacity of the memory module without significantly increasing its physical size. To be more specific, by vertically stacking memory chips, its footprint is not much larger than a single chip; by using thinned chips, a ×8 3D-MM (which comprises eight vertically stacked memory chips) could be as thin as ~1.2 mm. FIGS. 6A-7 disclose two preferred 3D-MM's—an offset 3D-MM and a double-sided 3D-MM. Other 3D-MM's, e.g. rotated 3D-MM, through-silicon-via-based 3D-MM, chip-in-polymer, package-stacked module, are disclosed in the article "Future ICs Go Vertical", by P. Garrou, *Semiconductor International*, February 2005; U.S. patent application Ser. No. 60/767,573, "Three-Dimensional Memory Module (3D-MM) Excelling Contemporary Micro-Drive (CMD)", filed Aug. 30, 2006; and others.

Referring now to FIGS. 6A-6B, a preferred offset 3D-MM is illustrated. It comprises two vertically stacked memory chips 100a, 100b. They form a 3D-MM stack 100, which is further stacked on a substrate 111. The substrate 111 may comprise, for example, a printed circuit board (PCB), a memory card, a lead frame, tape automated bonding (TAB) tape or others. Chip 100b is offset relative to chip 100a in such a way that all contact pads 102a on chip 100a that need electrical connections are exposed. In this preferred embodiment, the offset is along -x direction. After the offset, chip 100a is connected to chip 100b by bond wire 110b and to substrate 111 by bond wire 110a. The 3D-MM stack 100 is preferably encapsulated in a protective package 120, such as in a molding compound.

Referring now to FIG. 7, a preferred double-sided 3D-MM is illustrated. It comprises eight memory chips 100a-100h. They are grouped into two 3D-MM stacks: 100A and 100B. The 3D-MM stack 100A comprises four chips 100a-100d. They all face upward and are placed on the upper side of the substrate 111. The 3D-MM stack 100B comprises four chips 100e-100h. They all face downward and are placed on the lower side of the substrate 111. This preferred embodiment is particularly suitable for the 3D-MM comprising a large number of memory chips.

Figure 8:
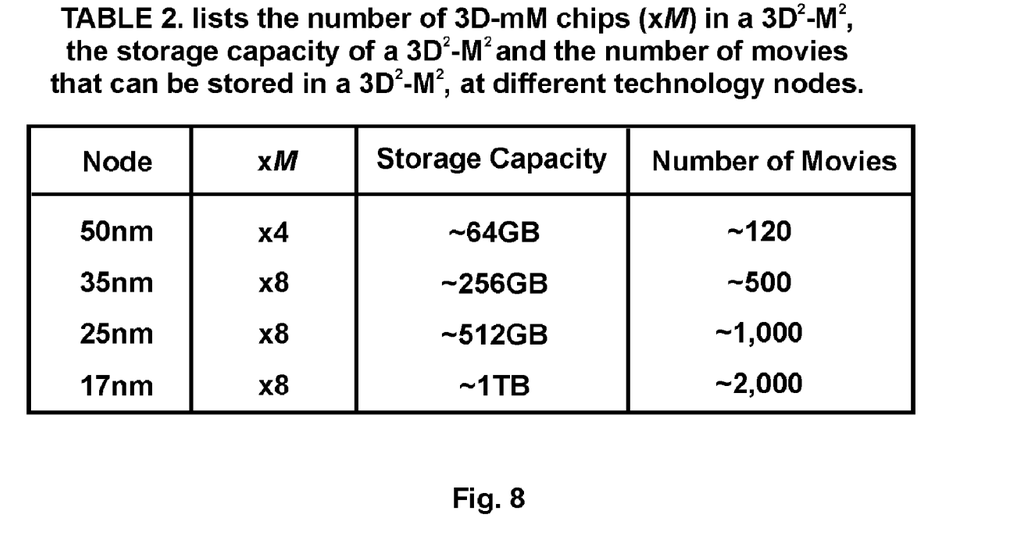
FIG. 8 (Table 2) lists the number of 3D-mM chips (×M) in a $3D^2$-$M^2$, the storage capacity of a $3D^2$-$M^2$, the number of movies that can be stored in a $3D^2$-$M^2$, at different technology nodes.

Combining 3D-mM and 3D-MM, $3D^2$-$M^2$ becomes an ultra-low-cost, ultra-large-capacity and small-form-factor memory module. It can store a PML, more particularly a PmL at a movie storage cost comparable to DVD. FIG. 8 (Table 2) lists the number of 3D-mM chips (×M) in a $3D^2$-$M^2$, the storage capacity of a $3D^2$-$M^2$, the number of movies that can be stored in a $3D^2$-$M^2$, at different technology nodes. At the 50 nm node, a ×4 $3D^2$-$M^2$ can reach a storage capacity of ~64 GB, enough to store ~120 movies, with movie storage cost ~\$0.4. This number is comparable to DVD, whose movie storage cost is ~\$0.2-\$0.7. At the 17 nm node, a ×8 $3D^2$-$mM^2$ could store ~1 TB, enough to store ~2,000 movies, with movie storage cost as low as ~\$0.05.

Figure 9:
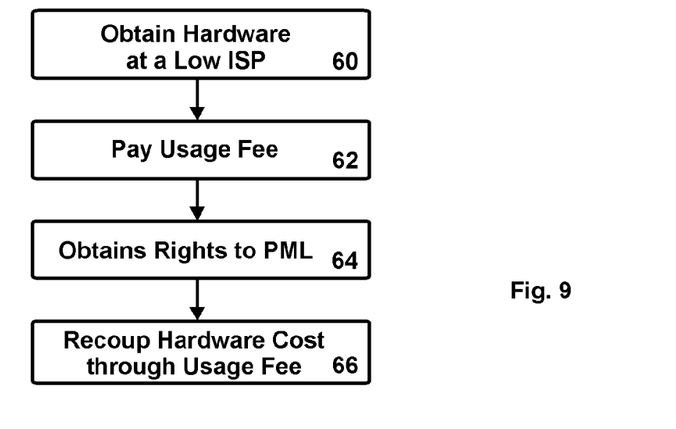
FIG. 9 illustrates a preferred distribution model for the preferred $3D^2$-$M^2$ system.

Referring now to FIG. 9, a preferred distribution model for the preferred $3D^2$-$M^2$ system 50 is illustrated. After obtaining the hardware (e.g. $3D^2$-$M^2$ 40) (step 60), a user needs to pay a usage fee (step 62) in order to obtain the desired rights (step 64). Here, payment can be made before usage (like a pre-paid phone card), or after usage (like a credit card). Because the usage fee could include not only the copyright fee, but also a portion of the hardware cost, the hardware manufacturer(s) could recoup the hardware cost through the usage fees (step 66). Accordingly, the user could just pay a low initial selling price (ISP) for the hardware (e.g. $3D^2$-$M^2$ 40) during purchase, or even get the hardware for free (step 60). This can lower the market entry barrier for the $3D^2$-$M^2$ and $3D^2$-$M^2$ system.

Figure 10A:
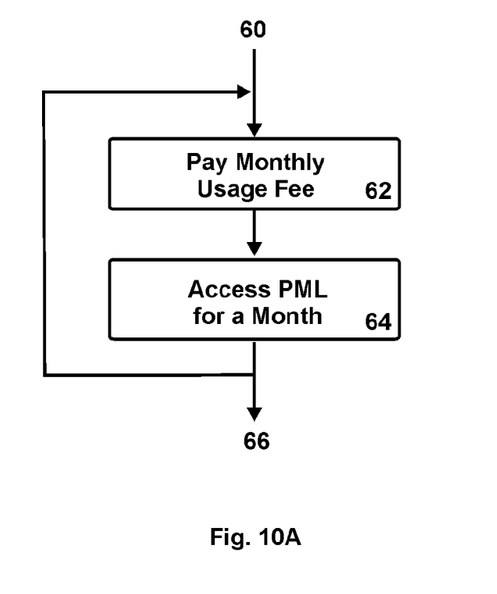
FIGS. 10A-10B illustrate two preferred access methods.
Figure 10B:
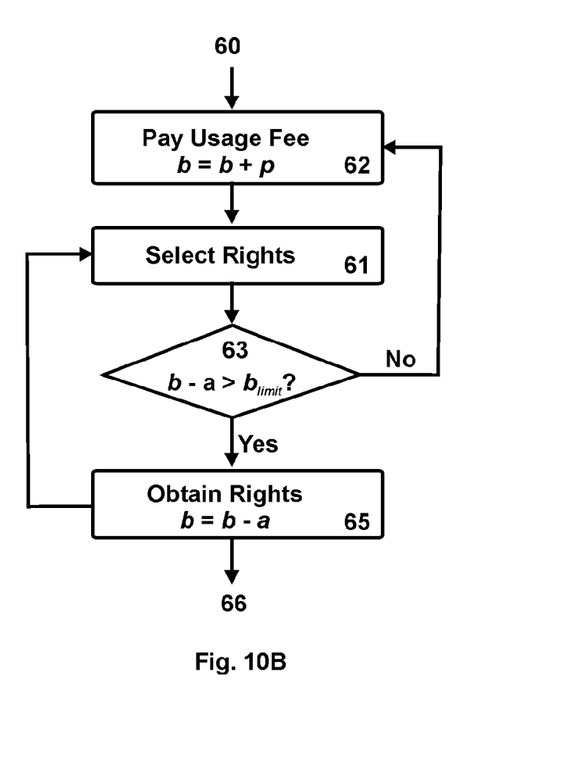

Referring now to FIGS. 10A-10B, two preferred access methods for the preferred $3D^2$-$M^2$ system 50 are illustrated. In the first preferred access method of FIG. 10A, a user pays a monthly usage fee (step 62), then accesses the PML 52 for a month (step 64). For example, after paying a monthly full-access fee (e.g. \$50), a user can watch all movies in the PML 52 within one month; or, after paying a monthly partial-access fee (e.g. \$20), a user can watch 10 movies from the PML 52 within one month.

In the second preferred access method of FIG. 10B, the $3D^2$-$M^2$ system 50 keeps record of an account balance (b), which tracks the payment and usage history. After the user makes a payment (p), the account balance is credited, i.e. b=b+p (step 62). During usage, the user selects the desired rights (step 61), which require a usage fee (a). As long as the remaining balance (=b−a) is above a pre-set threshold $b_{limit}$ (step 63), the user can obtain the selected rights and the corresponding usage fee is deducted from the account balance, i.e. b=b−a (step 65).

Figure 11A:
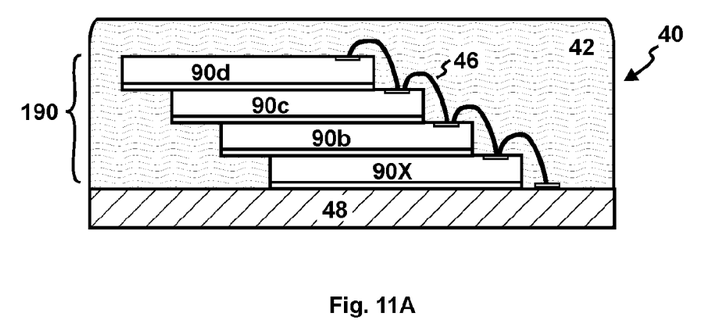
FIGS. 11A-11B illustrate another preferred $3D^2$-$M^2$ and its integrated 3D-mM chip.

FIG. 11A illustrates another preferred $3D^2$-$M^2$ 40. It comprises three 3D-mM chips 90b-90d and at least one integrated 3D-mM chip 90X. They are vertically stacked on the substrate 48. In the integrated 3D-mM chip 90X, the UC block 54 is integrated with the 3D-mM stack 80. FIG. 11B discloses more details on the integrated 3D-mM chip 90X. Because the 3D-mM cells (e.g. 96, 97, 98) do not occupy any substrate area, transistors 92t in the substrate 92 can be used to form an UC circuit 92uc, which performs the function of the UC block 54. During usage, the PML readout from the 3D-mM stack 80 is directly fed into the UC circuit 92uc. Because its readout is not exposed to the external world, PML 52 is well protected and could be in plaintext. Alternatively, the PML data could be encrypted (referring to FIG. 13B).

Figure 12B:
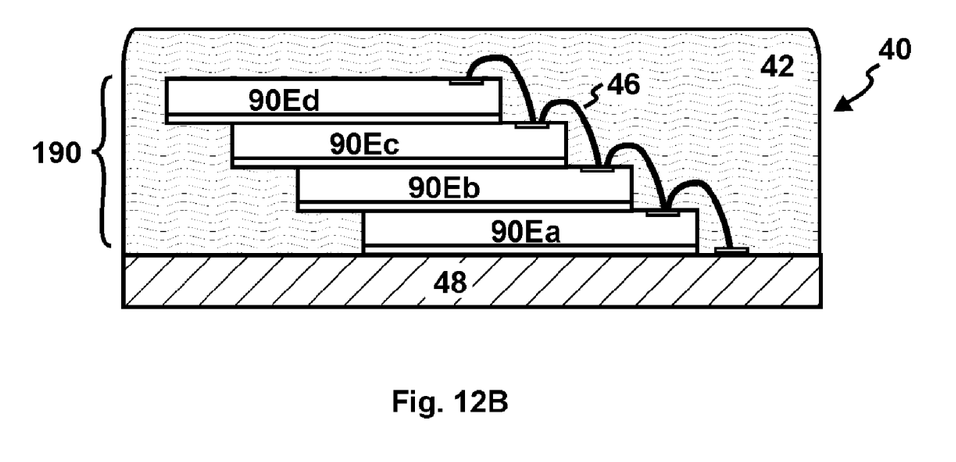

FIGS. 12A-12B illustrate another preferred $3D^2$-$M^2$ system 50 and its encrypted $3D^2$-$M^2$ 40. This preferred $3D^2$-$M^2$ system 50 comprises a $3D^2$-$M^2$ 40 and a mobile device 58. Unlike FIGS. 3 and 11A-11B, its UC block 54, realized by an UC circuit 58uc, is located in the mobile device 58. One benefit of this design is that the UC block 54 can share resources (e.g. uP, RAM, ROM) with the mobile device 58. On the other hand, because the $3D^2$-$M^2$ 40 does not comprise the UC block 54, its output needs to be encrypted. Accordingly, the 3D-mM chips 90Ea-90Ed are encrypted 3D-mM chips, i.e. at least a portion of their contents are encrypted. As a result, even though the PML readout can be exposed to the external world, the copyright of the PML 52 is still preserved. As mentioned before, the PML data in the $3D^2$-$M^2$'s of FIGS. 3 and 11-11B could also be encrypted. This can further enhance the copyright protection of their contents.

Figure 13A:
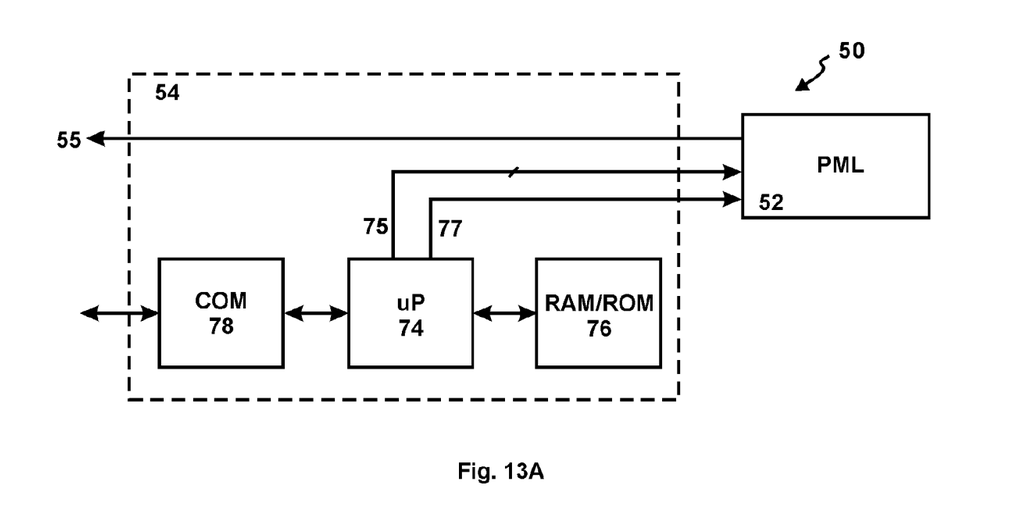
FIGS. 13A-13B are block diagrams of two preferred UC blocks.

Referring now to FIG. 13A, the block diagram of a first preferred UC block 54 is disclosed. It comprises a microprocessor (uP) 74, memory (including RAM and ROM) 76, and communication means (COM) 78. The ROM 76 stores information such as device ID, account balance, usage fees and other information. The uP 74 determines whether a user has the rights to access. If affirmative, a read-enable signal 77, together with the content-address 75, is sent to the 3D-mM chip that stores the content. This preferred embodiment can be applied to the $3D^2$-$M^2$'s which store the plaintext PML (e.g. FIGS. 3 and 11A-11B).

Figure 13B:
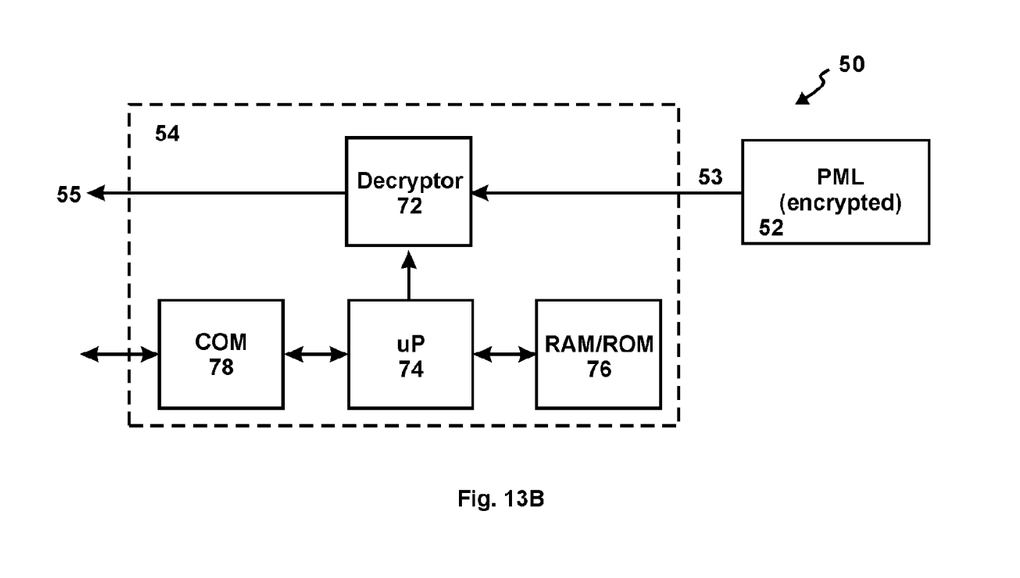

Referring now to FIG. 13B, the block diagram of a second preferred UC block 54 is disclosed. Compared with FIG. 13A, at least a portion of the PML data is encrypted. The preferred UC block 54 further comprises a decryptor 72, which can decrypt the encrypted PML data with an encryption key. When the uP 74 determines a user has the rights to access, the corresponding encryption key will be sent to the decryptor 72. This preferred embodiment can be applied to the $3D^2$-$M^2$'s which store the encrypted PML (e.g. FIGS. 3, 11A-11B and 12B).

In FIGS. 13A-13B, the $3D^2$-$M^2$ system 50 intermittently communicates with an authorization center through the COM 78. For example, during the payment process (step 62), a user first makes the payment (p) to the authorization center; then the authorization center sends back a code to credit the account balance (b). The COM 78 could be telephone (landline or cellular), internet (wired or wireless), or other means. Cellular phone is particularly convenient because cellular signals have the widest coverage and payment can be directly deducted from the user's cellular account.

Figure 14:
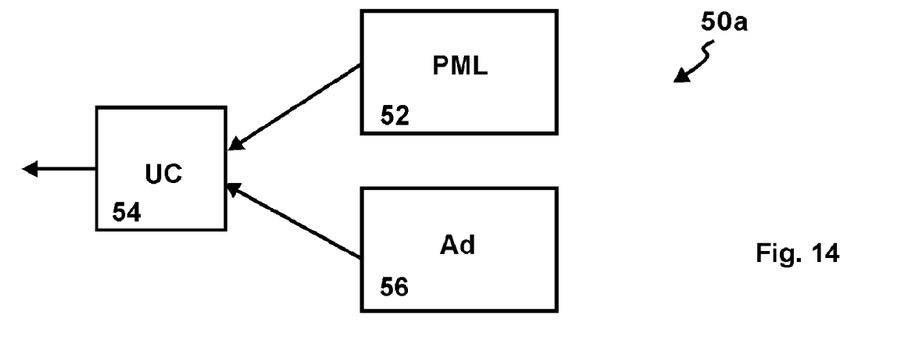
FIG. 14 illustrates a preferred $3D^2$-$M^2$ system with advertisements.

Referring now to FIG. 14, a preferred $3D^2$-$M^2$ system with advertisements 50a is illustrated. Besides the PML 52, it further contains advertisements 56. The UC block 54 controls which advertisement(s) to play and when. A user will be charged a reduced usage fee if advertisement playback is accepted during content playback; or, he will be charged a full usage fee if advertisement playback is not accepted.

Figure 15:
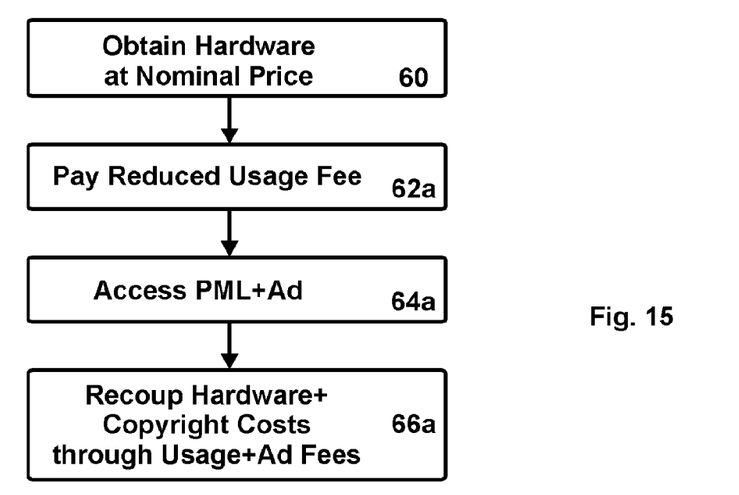
FIG. 15 illustrates a preferred distribution model of the preferred $3D^2$-$M^2$ system with advertisements.

Referring now to FIG. 15, a preferred distribution model for the preferred $3D^2$-$M^2$ system with advertisements 50a is disclosed. During content playback, if advertisement playback is accepted (step 64a), a user pays a reduced usage fee (step 62a). The hardware and copyright costs are recouped through both the usage and advertisement fees (step 66a). In an extreme case when enough advertisements are played back, a user could get the hardware for free, or even access the multimedia contents for free.

Figure 16:
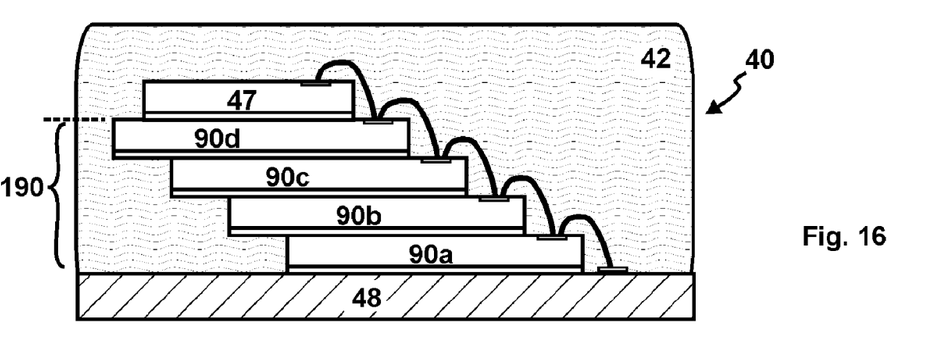
FIG. 16 illustrates a preferred $3D^2$-$M^2$ with updatability.

The pre-recorded contents stored in a 3D-mM cannot be altered after customer delivery. To update contents (including advertisements), a $3D^2$-$M^2$ system preferably comprises an electrically-programmable memory (EPM), e.g. flash memory. FIG. 16 illustrates a preferred upgradeable $3D^2$-$M^2$ 40. Besides the 3D-mM chips 90a-90d, it further comprises an EPM chip 47. This EPM chip 47 can be used to store updated contents, e.g. newly released movies, songs, books, softwares and/or advertisements. These updated contents can be broadcasted to users, or downloaded by users. The EPM chip 47 can also be used to store correctional code for the defective 3D-mM chip(s). Note that the EPM 47 can also be located in the substrate 92 of the 3D-mM chip 90X (FIG. 11B), or in the mobile device 58 (FIG. 12A). It should be apparent to those skilled in the art that chip 47 may also comprise logic and/or analog functions.

While illustrative embodiments have been shown and described, it would be apparent to those skilled in the art that may more modifications than that have been mentioned above are possible without departing from the inventive concepts set forth therein. For example, the memory chips in the $3D^2$-$M^2$ disclosed in the present invention are 3D-mM chips. $3D^2$-$M^2$ can, in fact, include other IC chips, e.g. other memory chips, analog chips and/or logic chips. The invention, therefore, is not to be limited except in the spirit of the appended claims.

What is claimed is:

1. A three-dimensional-memory-based three-dimensional memory module ($3D^2$-$M^2$), comprising:
    a plurality of vertically stacked three-dimensional mask-programmable memory (3D-mM) chips for storing a pre-recorded library, each of said 3D-mM chip comprising a plurality of vertically stacked mask-programmable memory levels; and
    a usage-control means for controlling the usage of said pre-recorded library.

2. The $3D^2$-$M^2$ according to claim 1, wherein at least a portion of the data in said pre-recorded library are encrypted.

3. The $3D^2$-$M^2$ according to claim 1, wherein said pre-recorded library contains textual, audio, image, video, game, and/or software contents.

4. The $3D^2$-$M^2$ according to claim 1, wherein said pre-recorded library contains a pre-recorded movie library.

5. The $3D^2$-$M^2$ according to claim 4, wherein the movie storage cost of said pre-recorded movie library is comparable to or less than DVD.

6. The $3D^2$-$M^2$ according to claim 1, wherein said usage-control means is located in a chip in said $3D^2$-$M^2$.

7. The $3D^2$-$M^2$ according to claim 1, whereby a user pays a low initial selling price for said $3D^2$-$M^2$ and later pays a usage fee for selected usage.

8. A three-dimensional-memory-based three-dimensional memory module ($3D^2$-$M^2$), comprising:
    a plurality of vertically stacked three-dimensional mask-programmable memory (3D-mM) chips for storing a pre-recorded library, each of said 3D-mM chip comprising a plurality of vertically stacked mask-programmable memory levels;
    wherein at least a portion of the data in said pre-recorded library are encrypted.

9. The $3D^2$-$M^2$ according to claim 8, wherein said pre-recorded library contains textual, audio, image, video, game, and/or software contents.

10. The $3D^2$-$M^2$ according to claim 8, wherein said pre-recorded library contains a pre-recorded movie library.

11. The $3D^2$-$M^2$ according to claim 8, whereby a user pays a low initial selling price for said $3D^2$-$M^2$ and later pays a usage fee for selected usage.

12. A three-dimensional-memory-based three-dimensional memory module ($3D^2$-$M^2$) system, comprising:
    a three-dimensional memory module (3D-MM) comprising a plurality of vertically stacked three-dimensional mask-programmable memory (3D-mM) chips for storing a pre-recorded library, wherein each of said 3D-mM chip comprises a plurality of vertically stacked mask-programmable memory levels; and
    a usage-control means for controlling the usage of said pre-recorded library.

13. The $3D^2$-$M^2$ system according to claim 12, further comprising a mobile device, wherein said mobile device plays back selected contents in said pre-recorded library.

14. The $3D^2$-$M^2$ system according to claim 13, wherein said usage-control means is located in said mobile device.

15. The $3D^2$-$M^2$ system according to claim 12, wherein at least a portion of the data in said pre-recorded library are encrypted.

16. The $3D^2$-$M^2$ system according to claim 12, wherein said pre-recorded library contains textual, audio, image, video, game, and/or software contents.

17. The $3D^2$-$M^2$ system according to claim 12, whereby a user pays a low initial selling price for said $3D^2$-$M^2$ system and later pays a usage fee for selected usage.

18. The $3D^2$-$M^2$ system according to claim 12, further containing advertisements, whereby a user pays a reduced usage fee when advertisement playback is allowed during content playback.

19. The $3D^2$-$M^2$ system according to claim 12, further comprising an electrically-programmable memory for storing updated information.

20. The $3D^2$-$M^2$ system according to claim 12, further comprising an electrically-programmable memory for storing correctional code.

* * * * *